(12) United States Patent
Wang et al.

(10) Patent No.: US 8,524,519 B2
(45) Date of Patent: Sep. 3, 2013

(54) MEMS MICROPHONE DEVICE AND METHOD FOR MAKING SAME

(75) Inventors: Chuan-Wei Wang, Hsin-Chu (TW); Chih-Ming Sun, Hsin-Chu (TW)

(73) Assignee: Pixart Imaging Incorporation, R.O.C., Hsin-Chu (TW)

(*) Notice: Subject to any disclaimer, the term of this patent is extended or adjusted under 35 U.S.C. 154(b) by 217 days.

(21) Appl. No.: 13/135,417

(22) Filed: Jul. 6, 2011

(65) Prior Publication Data
US 2012/0261775 A1    Oct. 18, 2012

(30) Foreign Application Priority Data
Apr. 12, 2011    (TW) .............................. 100112696 A (51) Int. Cl.
*H01L 21/00*    (2006.01)

(52) U.S. Cl.
USPC ................ 438/50; 438/51; 257/416; 257/417

(58) Field of Classification Search
USPC ................. 257/414, 415, 416, 417, 418, 419, 257/420, E29.324, E21.002; 438/50, 51
See application file for complete search history.

(56) References Cited

U.S. PATENT DOCUMENTS

| 7,221,767 | B2 | 5/2007 | Mullenborn et al. |
| 7,436,054 | B2 * | 10/2008 | Zhe ................................ 257/686 |
| 2006/0205106 | A1 * | 9/2006 | Fukuda et al. .................. 438/52 |
| 2007/0040231 | A1 * | 2/2007 | Harney et al. ................. 257/415 |
| 2007/0071268 | A1 | 3/2007 | Harney et al. |
| 2007/0087466 | A1 | 4/2007 | Weigold et al. |
| 2008/0137886 | A1 * | 6/2008 | Schrank ........................ 381/174 |
| 2008/0175418 | A1 | 7/2008 | Zhang et al. |
| 2009/0218668 | A1 * | 9/2009 | Zhe et al. ...................... 257/680 |

* cited by examiner

*Primary Examiner* — Cuong Q Nguyen
*Assistant Examiner* — Yosef Gebreyesus
(74) *Attorney, Agent, or Firm* — Tung & Associates (57) ABSTRACT

The present invention discloses a MEMS microphone device and its manufacturing method. The MEMS microphone device includes: a substrate including a first cavity; a MEMS device region above the substrate, wherein the MEMS device region includes a metal layer, a via layer, an insulating material region and a second cavity; a mask layer above the MEMS device region; a first lid having at least one opening communicating with the second cavity, the first lid being fixed above the mask layer; and a second lid fixed under the substrate.

10 Claims, 7 Drawing Sheets

MEMS MICROPHONE DEVICE AND METHOD FOR MAKING SAME

CROSS REFERENCE

The present invention claims priority to TW 100112696, filed on Apr. 12, 2011.

BACKGROUND OF THE INVENTION

1. Field of Invention

The present invention relates to a Micro-Electro-Mechanical System (MEMS) microphone device and its manufacturing method.

2. Description of Related Art

Figure 1:
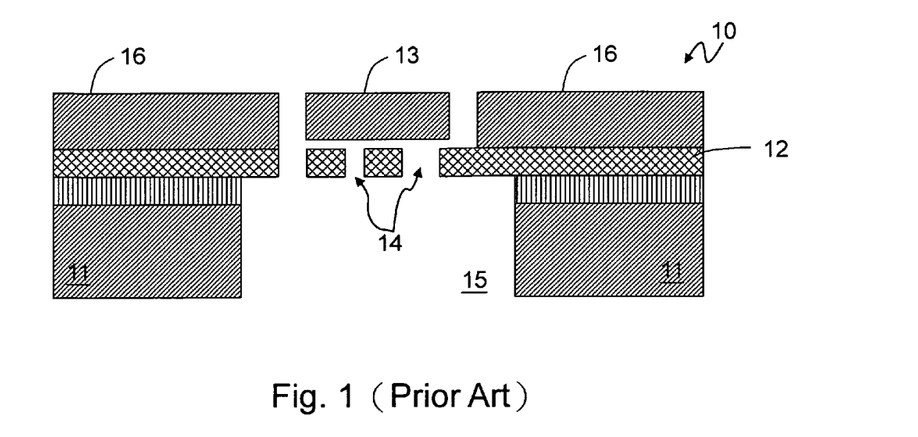
FIG. 1 shows a MEMS microphone device disclosed in U.S. publication No. 2008/0175418.

FIG. 1 shows a MEMS microphone device 10 disclosed in U.S. publication No. 2008/0175418. As shown in FIG. 1, the MEMS microphone device 10 includes: a substrate 11, a back-plate 12, a flexible diaphragm 13, through-holes 14, backside cavity 15, and a stationary portion 16. In one embodiment, the flexible diaphragm 13 may include a material of, for example, polysilicon, and the back-plate 12 may include a material of, for example, single crystal silicon. The back-plate 12 has the through-holes 14 communicating with the backside cavity 15, and the flexible diaphragm 13 is connected with the stationary portion 16 by springs. When a voice signal vibrates the flexible diaphragm 13, a capacitance is changed accordingly. Then, the changed capacitance is converted to an electronic signal by a circuit. In this prior art, the MEMS microphone device 10 still requires a series of complicated package processes so that a product having the MEMS microphone device 10 requires a large area and is difficult to shrink.

In addition, similar to the U.S. publication No. 2008/0175418, the MEMS microphone devices disclosed in U.S. publication No. 2008/0175418, U.S. publication No. US 2008/0175418 and U.S. Pat. No. 7,221,767 also require a series of complicated package processes so that a product having one of the MEMS microphone devices requires a large area and is difficult to shrink.

In the view of above, to overcome the drawback in the prior art, the present invention proposes a MEMS microphone device and its manufacturing method which improve wafer-level manufacturing process to simplify package process and save room so that the whole device can achieve chip size package (CSP).

SUMMARY OF THE INVENTION

An objective of the present invention is to provide a method for manufacturing a MEMS microphone device.

Another objective of the present invention is to provide a MEMS microphone device.

To achieve the foregoing objectives, in one perspective of the present invention, it provides a method for manufacturing a MEMS microphone device, comprising: providing a substrate; forming at least one metal layer, at least one via layer and an insulating material region above the substrate, the at least one metal layer including a top metal layer; forming a mask layer above the top metal layer; removing a portion of the mask layer to expose a portion of the insulating material region; fixing a first lid above the mask layer, the first lid having at least one opening; etching the backside of the substrate to form a first cavity; fixing a second lid under the substrate; and removing a portion of the insulating material region to form a second cavity, wherein the second cavity communicates with the first cavity and the at least one opening, and wherein the second cavity, the at least one metal layer, the at least one via layer, and the insulating material region together form a MEMS device region.

In the foregoing method, the first cavity may be formed by etching the backside of the substrate with inductively coupled plasma (ICP).

In the foregoing method, the first lid and the second lid may be fixed by means of eutectic, glass frit, epoxy or solder.

The foregoing method may further include providing at least one wire through the substrate and the second lid by a through-silicon via (TSV) process, or may further include providing at least one wire following a path along a lateral side of the substrate and extending to the bottom surface of the second lid by a T-contact process.

In the foregoing method, a portion of the insulating material region may be removed by HF vapor to form a second cavity.

In another perspective of the present invention, it provides a MEMS microphone device, comprising: a substrate including a first cavity; a MEMS device region above the substrate, wherein the MEMS device region includes at least one metal layer, at least one via layer, an insulating material region and a second cavity; a mask layer above the MEMS device region; a first lid having at least one opening communicating with the second cavity, the first lid being fixed above the mask layer; and a second lid fixed under the substrate.

The foregoing MEMS microphone device may further include an adhesion layer between the first lid and the MEMS device region.

In the foregoing MEMS microphone device, the first lid and the second lid may be formed by a silicon wafer.

The foregoing MEMS microphone device may further include at least one wire, wherein the at least one wire goes through the substrate and the second lid, or follows a path along a lateral side of the substrate and extends to a bottom surface of the second lid.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelations between the layers/parts, but not drawn according to actual scale.

Figure 2:
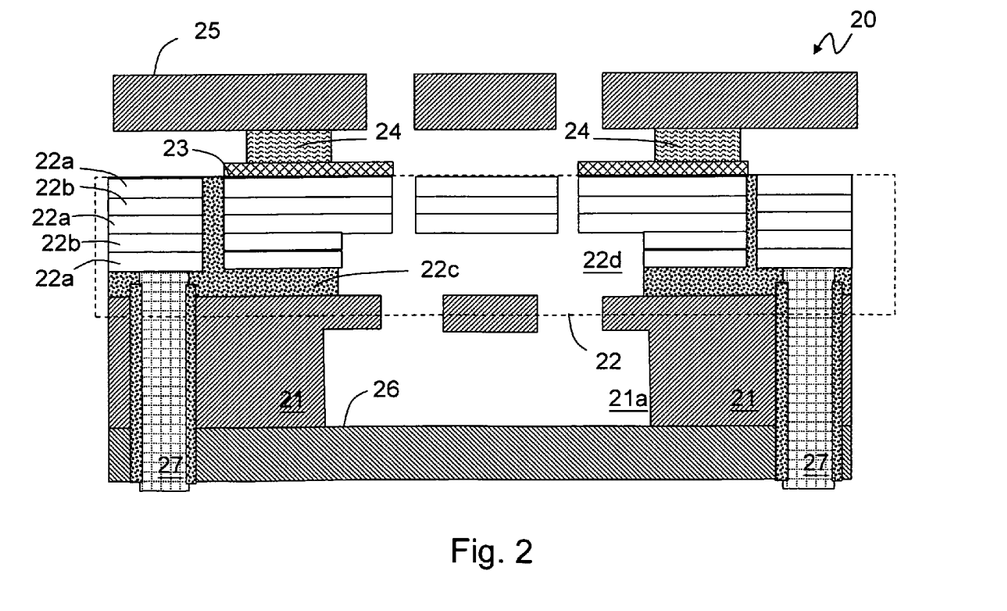
FIG. 2 shows, by cross-section view, a first embodiment of the present invention.

FIG. 2 shows, by cross-section view, a first embodiment of the present invention. As shown in FIG. 2, a MEMS microphone device 20 includes: a substrate 21, a MEMS device region 22, a mask layer 23, an adhesion layer 24, a first lid 25, a second lid 26, and wires 27. In the MEMS microphone device 20, the substrate 21 includes a first cavity 21a which is not limited to the shape shown in the figure. The MEMS device region 22 is formed above the substrate 21 and includes metal layers 22a, via layers 22b, an insulating material region 22c and a second cavity 22d formed inside the MEMS device region 22, wherein the numbers of the metal layers 22a and via layers 22b may respectively be singular or plural. The metal layers 22a include a material of, for example but not limited to, aluminum; the via layers 22b include a material of, for example but not limited to, tungsten; the insulating material region 22c includes a material of, for example but not limited to, silicon oxide. In addition, the second cavity 22d communicates with the first cavity 21a so that the MEMS device region 22 is responsive to acoustic pressure. The mask layer 23 is provided above the MEMS device region 22. The first lid 25 is fixed above the mask layer 23 and has at least one opening communicating with the second cavity 22d and the first cavity 21a, wherein the first lid 25 is formed by, for example but not limited to, a silicon wafer. In this embodiment, an adhesion layer 24 is provided between the first lid 25 and the mask layer 23 for fixing the first lid 25, but the adhesion layer 24 is not absolutely required if the first lid 25 is fixed by other means. The second lid 26 is fixed under the substrate 21 and is formed by, for example but not limited to, a silicon wafer. The wires 27 go through the substrate 21 and the second lid 26 for transmitting signals from the MEMS device region 22 to the outside of the MEMS microphone device 20.

Figure 3A:
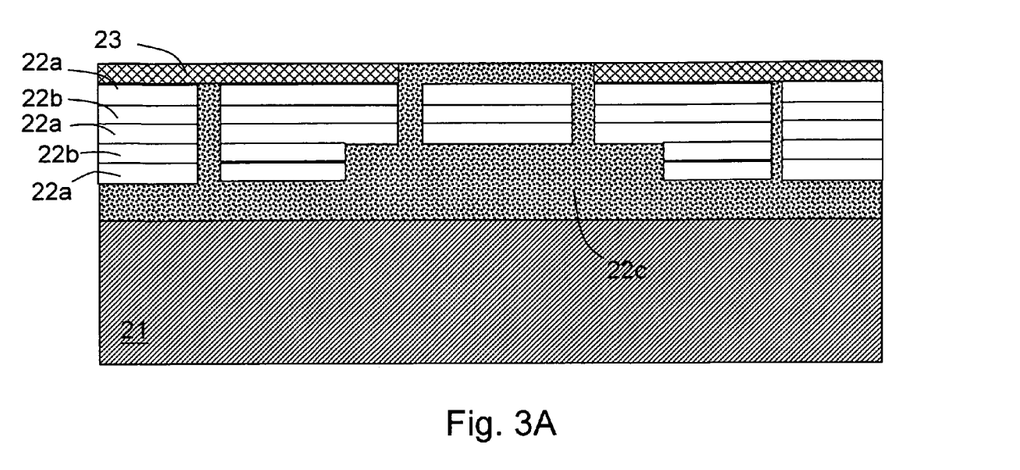
FIGS. 3A-3I show manufacturing process steps for an embodiment of the MEMS microphone device according to the present invention.
Figure 3B:
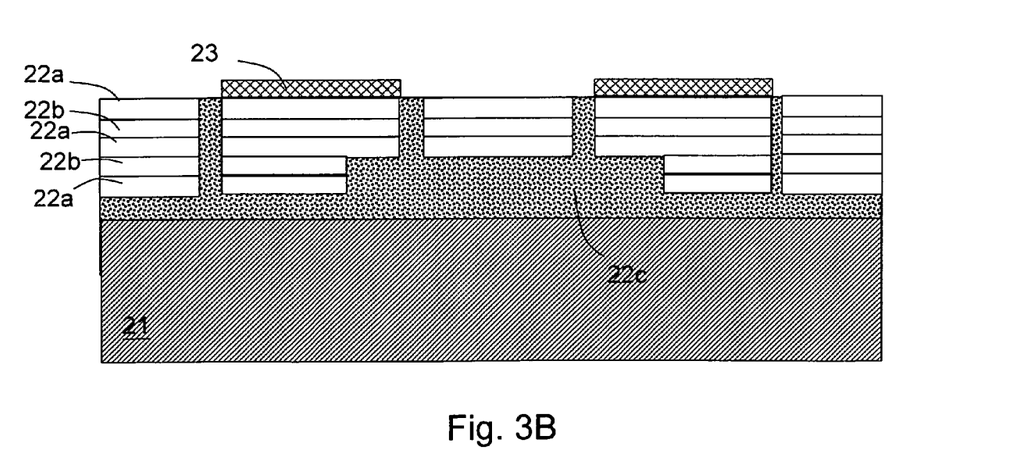
Figure 3C:
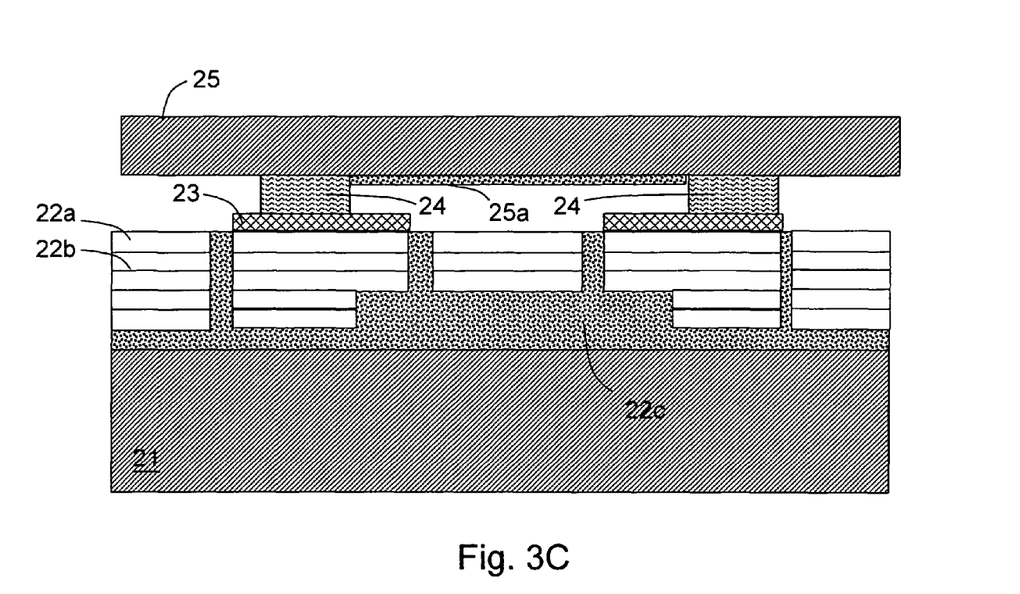
Figure 3D:
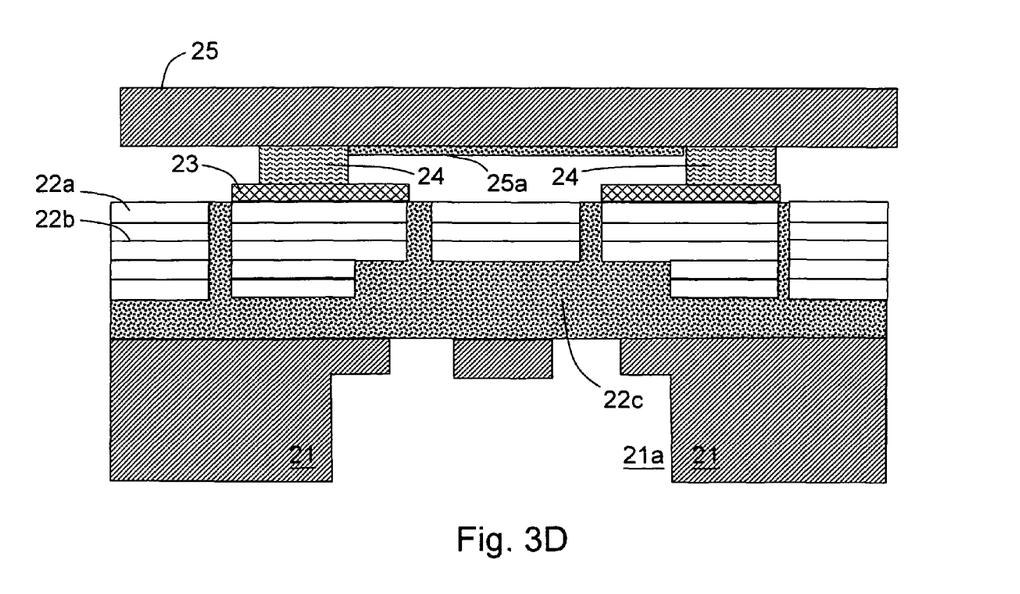
Figure 3E:
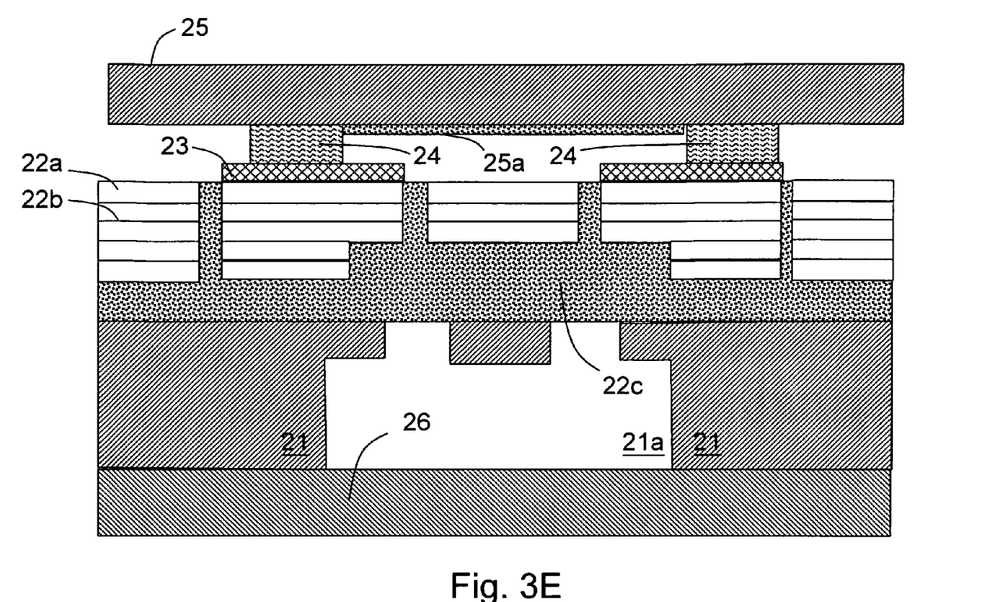
Figure 3F:
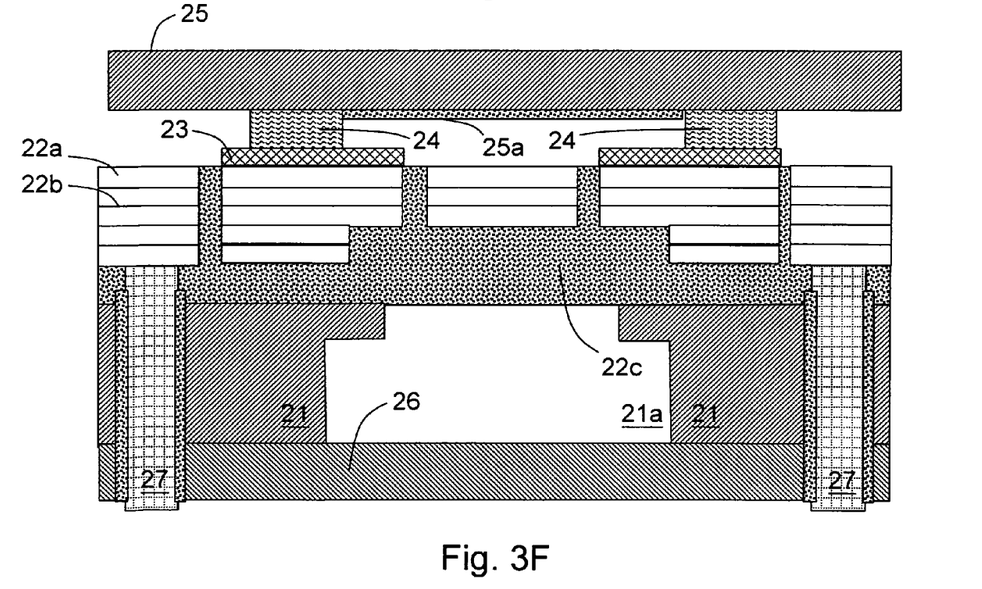
Figure 3G:
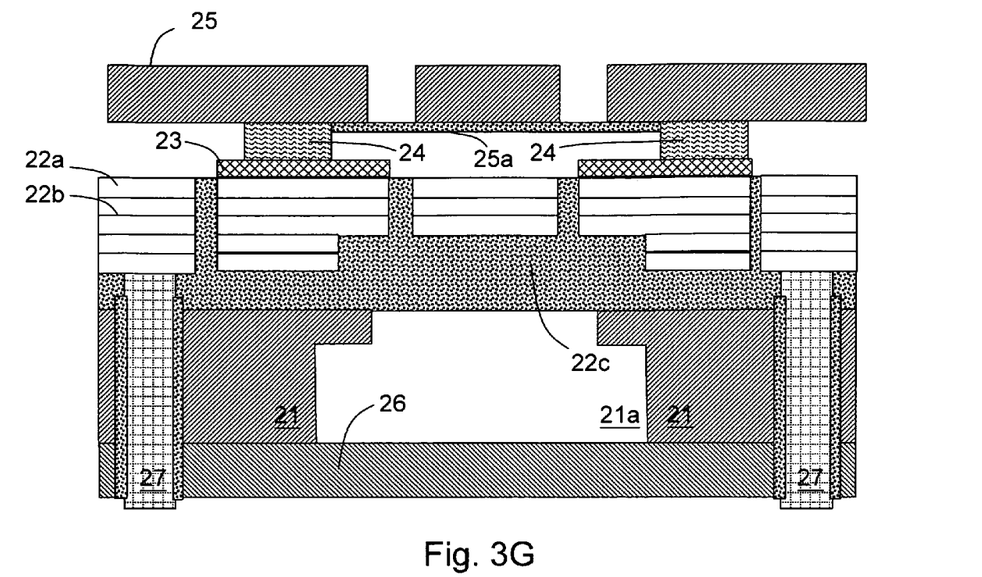
Figure 3H:
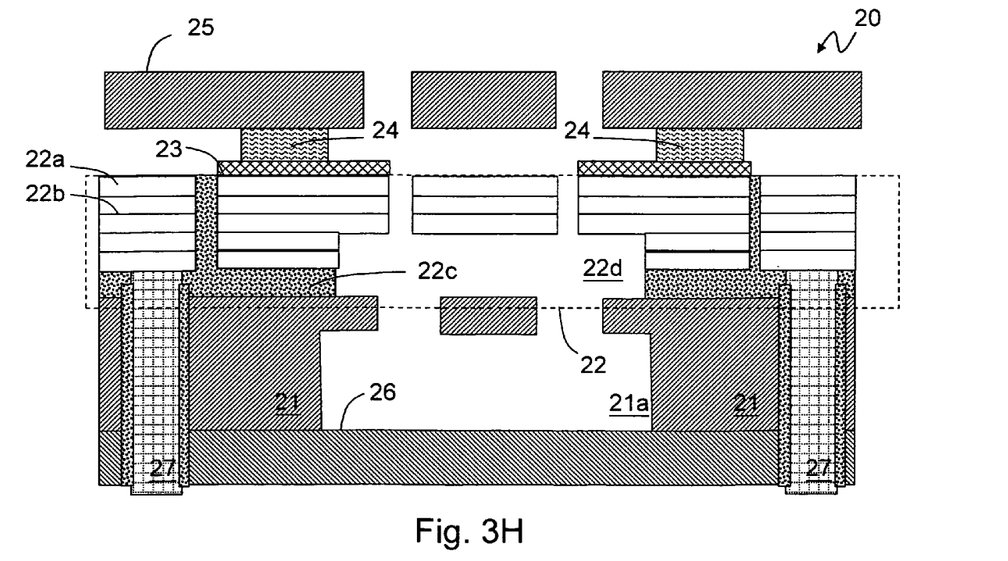

FIGS. 3A-3H show manufacturing process steps for the MEMS microphone device 20, as the following: First, as shown in FIG. 3A, the substrate 21 is provided, and the metal layers 22a, the via layers 22b, the insulating material region 22c and the mask layer 23 are formed above the substrate 21. Second, as shown in FIG. 3B, a portion of the mask layer 23 and the surface of the insulating material region 22c are removed. Next, as shown in FIG. 3C, the first lid 25 is fixed above the mask layer 23 by means of, for example but not limited to, eutectic, glass frit, epoxy or solder, wherein an etch stop layer 25a is formed under the first lid 25, and the adhesion layer 24 is formed between the first lid 25 and the mask layer 23. Next, as shown in FIG. 3D, the backside of the substrate 21 is etched by, for example but not limited to, inductively coupled plasma (ICP) for forming the first cavity 21a. Next, as shown in FIG. 3E, the second lid 26 is fixed under the substrate 21 by means of, for example but not limited to, eutectic, glass frit, epoxy or solder. Next, as shown in FIG. 3F, the wires 27 going through the substrate 21 and the second lid 26 are formed by a through-silicon via (TSV) process, for transmitting the signals from the MEMS device region 22 to the outside of the MEMS microphone device 20. Next, as shown in FIG. 3G, the first lid 25 is etched by, for example but not limited to, ICP for forming openings. Finally, as shown in FIG. 3H, the etch stop layer 25a and a portion of the insulating material region 22c are removed by, for example, HF vapor for forming the second cavity 22d, wherein the second cavity 22d communicates with the first cavity 21a and the openings of the first lid 25, and wherein the second cavity 22d, the metal layers 22a, the via layer 22b, and the insulating material region 22c together form a MEMS device region 22.

Figure 3I:
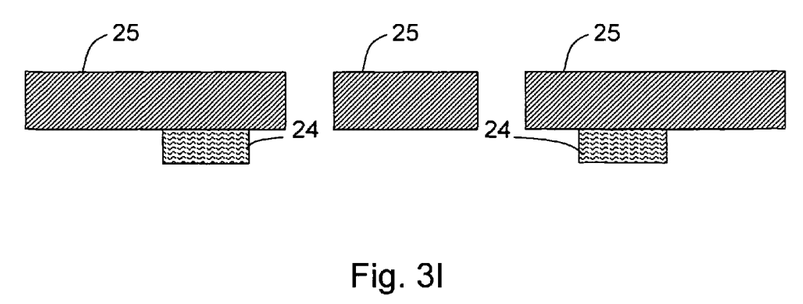

Please refer to FIG. 3I which describes another way for manufacturing the MEMS microphone device 20. In this figure, the first lid 25 is not fixed above the substrate 21 in an early stage of the process, but instead, it is first etched to form the openings and fixed with the adhesion layer 24 (alternatively, the order of the etching step and the fixing step can be interchanged), before it is fixed above the substrate 21. After the manufacturing process steps related to the substrate 21 are finished, the first lid 25 is fixed above the mask layer 23. In this way, a manufacturer can perform the manufacturing process steps related to the substrate 21 and those related to the first lid 25 in parallel respectively, and combine the substrate 21 and the first lid 25 afterward.

Figure 4:
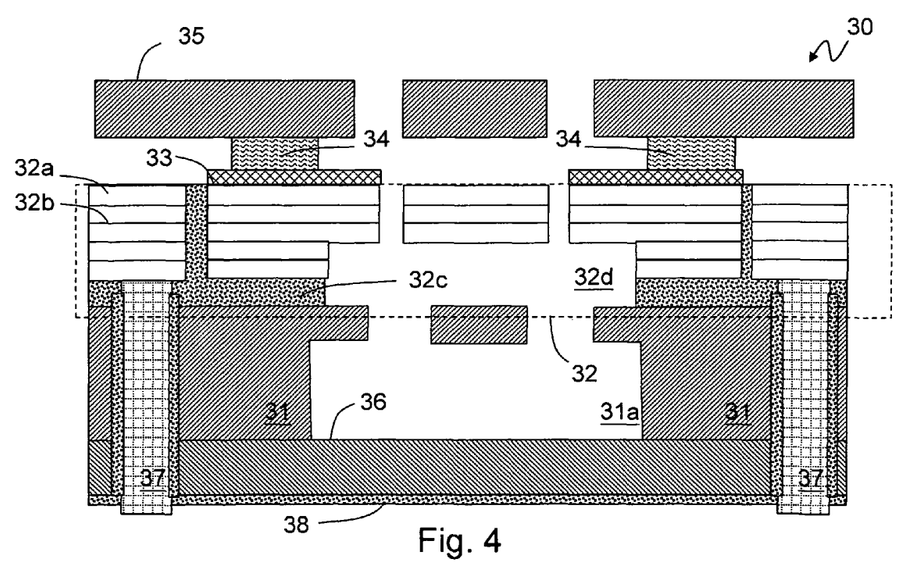
FIG. 4 shows, by cross-section view, a second embodiment of the present invention.

FIG. 4 shows, by cross-section view, a second embodiment of the present invention. The MEMS microphone device 30 includes: a substrate 31, a MEMS device region 32, a mask layer 33, an adhesion layer 34, a first lid 35, a second lid 36, wires 37, and an insulating layer 38. The insulating layer 38 is provided below a bottom surface of the second lid 36, so as to prevent the wires 37 from direct contact with the second lid 36. Besides the insulating layer 38, the functionality and manufacturing process of the second embodiment are not substantially different from those of the first embodiment and therefore the details are omitted.

Figure 5:
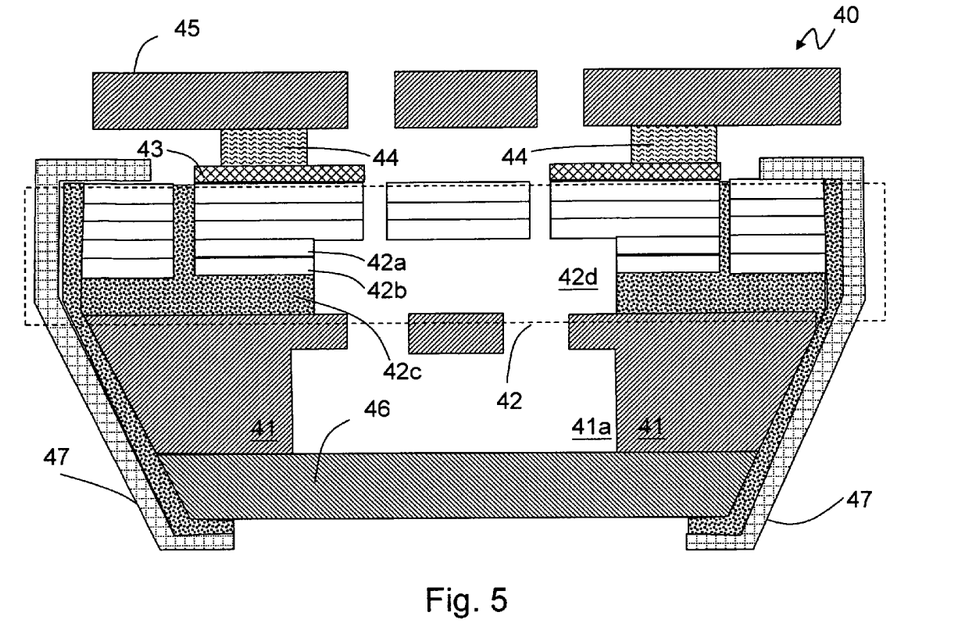
FIG. 5 shows, by cross-section view, a third embodiment of the present invention.

FIG. 5 shows, by cross-section view, a third embodiment of the present invention. As shown in FIG. 5, the MEMS microphone device 40 includes: a substrate 41, a MEMS device region 42, a mask layer 43, an adhesion layer 44, a first lid 45, a second lid 46, and wires 47. In the MEMS microphone device 40, the substrate 41 includes a first cavity 41a which is not limited to the shape shown in the figure. The third embodiment is different from the first embodiment in that the wires 47 for transmitting signals from the MEMS device region 42 to the outside of the MEMS microphone device 40 are formed by a T-contact process. In detail, the wires 47 follow paths along lateral sides of the substrate 41 and extend to the bottom surface of the second lid 46. The manufacturing process steps of this embodiment are similar to those of the first embodiment except the step for forming the wires; those similar steps are not redundantly repeated here. Likely, a manufacturer can perform the manufacturing process steps related to the substrate 41 and those related the first lid 45 in parallel respectively, and combine the substrate 41 and the first lid 45 afterward.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the numbers of the metal layers and the via layers in the present invention are not limited to the numbers shown in the embodiments, but can be any other numbers. As another example, the numbers and shapes of the openings and cavities are not limited to the numbers and shapes shown in the embodiments, but can be any other numbers and shapes. As another example, the shapes of the wires are not limited to the shapes shown in the embodiments, but can be any other shapes. As yet another example, the manufacturing process steps of the MEMS microphone devices can be rearranged as long as the characteristics of the devices are not affected therefore. Thus, the present invention should cover all such and other modifications and variations, which should be interpreted to fall within the scope of the following claims and their equivalents.

What is claimed is:
1. A method for manufacturing a MEMS microphone device, comprising:
   providing a substrate;
   forming at least one metal layer, at least one via layer and an insulating material region above the substrate, the at least one metal layer including a top metal layer;
   forming a mask layer above the top metal layer;

removing a portion of the mask layer to expose a portion of the insulating material region;

fixing a first lid above the mask layer, the first lid having at least one opening;

etching the backside of the substrate to form a first cavity;

fixing a second lid under the substrate; and removing a portion of the insulating material region to form a second cavity, wherein the second cavity communicates with the first cavity and the at least one opening, and wherein the second cavity, the at least one metal layer, the at least one via layer, and the insulating material region together form a MEMS device region.

2. The method of claim 1, further comprising: forming an adhesion layer between the first lid and the mask layer for fixing the first lid.

3. The method of claim 1, wherein the step of etching the backside of the substrate to form a first cavity includes etching the backside of the substrate by inductively coupled plasma (ICP).

4. The method of claim 1, wherein the step of fixing a first lid having at least one opening above the mask layer includes:
forming an etch stop layer under the first lid; and
etching the first lid to form the at least one opening.

5. The method of claim 4, further comprising: removing the etch stop layer by HF vapor.

6. The method of claim 1, wherein the step of fixing a first, lid having at least one opening above the mask layer includes fixing the first lid by means of eutectic, glass frit, epoxy or solder.

7. The method of claim 1, wherein the step of fixing a second lid under the substrate includes fixing the second lid by means of eutectic, glass frit, epoxy or solder.

8. The method of claim 1, further comprising: forming at least one wire for transmitting signals from the MEMS device region to the outside of the MEMS microphone device.

9. The method of claim 8, wherein the step of forming at least one wire for transmitting signals from the MEMS device region to the outside of the MEMS microphone includes providing the at least one wire through the substrate and the second lid by a through-silicon via (TSV) process or a T-contact process.

10. The method of claim 1, wherein the step of removing a portion of the insulating material region to form a second cavity includes etching the insulating material region by HF vapor.

* * * * *